United States Patent
Loh

(10) Patent No.: US 6,639,264 B1
(45) Date of Patent: Oct. 28, 2003

(54) METHOD AND STRUCTURE FOR SURFACE STATE PASSIVATION TO IMPROVE YIELD AND RELIABILITY OF INTEGRATED CIRCUIT STRUCTURES

(75) Inventor: Stephen K. Loh, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/210,247

(22) Filed: Dec. 11, 1998

(51) Int. Cl.[7] .................... H01L 29/76; H01L 31/062
(52) U.S. Cl. .................... 257/301; 257/56; 257/386; 257/397; 257/302; 257/305; 438/243; 438/386
(58) Field of Search ................ 257/301, 401, 257/408, 397, 315, 386, 56, 287; 438/243, 386, 159, 303

(56) References Cited

U.S. PATENT DOCUMENTS

| | | | |
|---|---|---|---|
| 4,144,100 A | 3/1979 | MacIver et al. | 148/1.5 |
| 4,748,131 A | 5/1988 | Zietlow | 437/24 |
| 5,250,829 A * | 10/1993 | Bronner et al. | 257/301 |
| 5,364,804 A * | 11/1994 | Ho et al. | 437/41 |
| 5,393,676 A | 2/1995 | Anjum et al. | 437/24 |
| 5,554,883 A | 9/1996 | Kuroi | 257/617 |
| 5,578,507 A | 11/1996 | Kuroi | 437/24 |
| 5,748,521 A * | 5/1998 | Lee | 365/149 |
| 5,831,319 A * | 11/1998 | Pan | 257/408 |
| 5,923,949 A * | 7/1999 | Gardner et al. | 438/40 |
| 5,994,192 A * | 11/1999 | Chen | 438/303 |
| 6,130,145 A * | 10/2000 | Ilg et al. | 438/592 |
| 6,140,691 A * | 10/2000 | Gardner et al. | 257/506 |

FOREIGN PATENT DOCUMENTS

| JP | 5006898 A | 1/1993 |
|---|---|---|
| JP | 7058813 A | 3/1995 |

OTHER PUBLICATIONS

Peter J. Wright et al., "The Effect of Fluorine in Silicon Dioxide Gate Dielectrics", IEEE Electron Devices, vol. 36, No. 5, May 1989, pp 879–889.*

Lai–Juh Chen et al., "Fluorine–Implanted Treatment SOG for the Non–Etchback Intermetal Dielectric", VMIC Conference, Jun. 1994, pp 81–86.*

* cited by examiner

Primary Examiner—Steven Loke
Assistant Examiner—Donghee Kang
(74) Attorney, Agent, or Firm—Ratner & Prestia

(57) ABSTRACT

A method for passivating surface states in an integrated circuit structure having a gate conductor with a gate dielectric layer. The method comprises the step of fabricating a solid state source of fluorine in close proximity to the gate dielectric layer. In addition, an integrated circuit structure is provided. The structure comprises a substrate having a gate dielectric layer on the substrate and a gate conductor on the substrate above the gate dielectric layer. The gate conductor further comprises an edge and a solid state source of fluorine in close proximity to the gate dielectric layer.

14 Claims, 3 Drawing Sheets

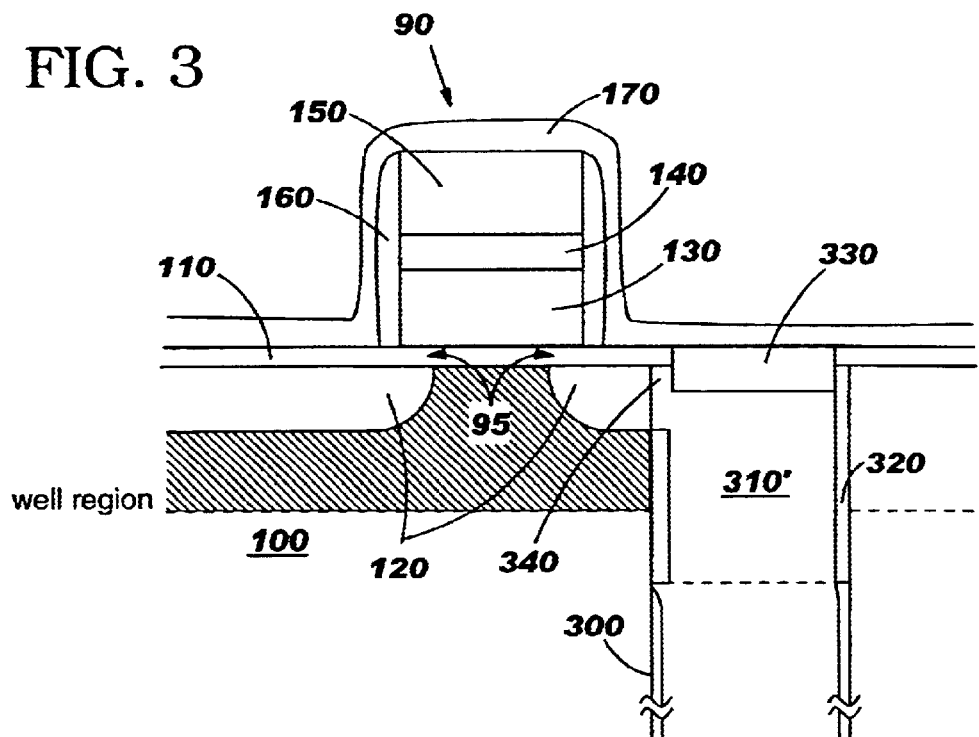
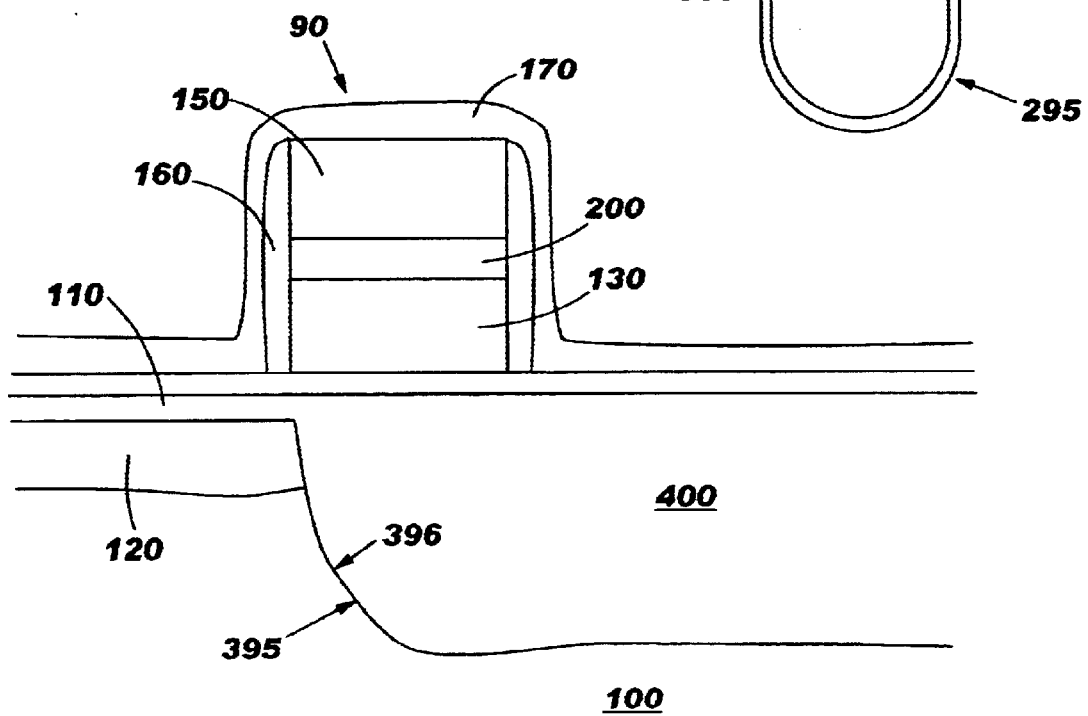

METHOD AND STRUCTURE FOR SURFACE STATE PASSIVATION TO IMPROVE YIELD AND RELIABILITY OF INTEGRATED CIRCUIT STRUCTURES

TECHNICAL FIELD

The present invention relates to passivation of surface states created during fabrication or operation of integrated circuit structures such as a field effect transistor (FET).

BACKGROUND OF THE INVENTION

It is known in the art that conventional integrated circuit fabrication techniques may create defective film interfaces that are manifested electronically as surface states. For instance, such defective film interfaces may arise in a film growth step, or may be created by charging damage, such as from high energy plasma processes used to pattern contact vias or conductive lines. Surface states may also arise from voltage stress during operation. Weak or open bonds that result from damage to the chemical bonds at an interface, called "dangling bonds," are one type of defective film interface that may cause a surface state.

Referring now to FIG. 1, there is shown a typical metal-oxide-semiconductor (MOS) gate conductor 90 of the prior art located on a substrate 100. Substrate 100 typically comprises doped silicon and includes implanted source and drain regions 120. Over implanted source and drain regions 120 is deposited a gate dielectric layer 110, commonly an oxide or an oxide-nitride composite. Gate conductor 90 comprises a polysilicon layer 130, a silicide layer 140, and an insulator layer 150, each layer deposited and patterned by conventional lithographic and etching techniques well known in the art. A typical gate conductor 90 may or may not contain the silicide layer 140. Insulator layer 150 electrically insulates the gate conductor 90 and is most commonly oxide or nitride. Insulator layer 150 may also serve as the etch mask. A spacer film 160 can be used to create a lightly doped junction near the gate. The spacer film 160 may or may not contain a layer created by thermally oxidizing the polysilicon layer 130.

An encapsulating film 170, typically comprising silicon nitride, may be deposited over the entire gate conductor and substrate structure. Encapsulation protects the devices from mobile ion contamination from such elements as sodium or potassium. Unfortunately, encapsulation also prevents passivating species such as hydrogen or fluorine from diffusing from overlying films directly to critical interfaces (described below), except through openings such as for device contacts.

Dangling bonds 105 are typically formed during processing, as described above, at the interface between gate dielectric 110 and silicon substrate 100. Dangling bonds 105 are indicated by dashes in FIG. 1. Because the edge or corner of the gate conductor 90 has the highest potential on the gate dielectric, the edge region 95 is most susceptible to damage and surface state formation.

At critical device interfaces, such as the interface between gate dielectric 110 and silicon substrate 100, dangling bonds 105 promote electron-hole pair recombination. Excessive electron-hole recombination is measured as high device leakage. Such leakage can adversely impact device performance through threshold voltage, data retention time, and standby power degradation.

Dangling bonds 105 can be repaired or passivated by reacting with a suitable reactant. The most widely used method to passivate surface states is by annealing the devices in hydrogen or forming gas at approximately 400–450° C. This anneal is thought to allow hydrogen to diffuse to the interface between gate dielectric 110 and silicon substrate 100 where hydrogen atoms terminate the dangling bonds. Injected hot electrons can easily break hydrogen or hydroxyl terminated bonds, however, thereby de-passivating and regenerating the surface states. Thus, hydrogen passivation increases susceptibility to hot electron degradation over time, reducing reliability.

It is also known that fluorine may be used to repair or passivate dangling bonds 105. Fluorine binds to silicon dangling bonds more strongly than hydrogen, forming a much more robust passivant and reducing gate-induced device leakage (GIDL). As a more effective passivant, fluorine is harder to remove than hydrogen during thermal or voltage stress, thus improving device reliability.

Direct addition of fluorine to the gate dielectric, either by implantation or by doping, may be insufficient, however, to heal damage such as charge-related damage caused by high energy plasma processes during later contact or wiring level fabrication. Excess fluorine at the gate also may degrade device performance by thickening the gate dielectric, which is particularly undesirable for thin gates (less than 100 Angstroms thick). Residual fluorine in the gate dielectric due to a $BF^{2+}$ implant has also been reported to increase the hot electron resistance of devices. Similarly, excess implanted fluorine in gate polysilicon can diffuse out and produce a more hot-electron resistant interface. Thus, direct addition of fluorine to the gate dielectric or gate polysilicon layer has numerous drawbacks.

Reliable surface state passivation is still needed, however, for integrated circuits to survive packaging thermal cycles or device end-of-life conditions, as simulated by reliability stressing. Therefore, there is a need to provide the benefits of fluorine surface state passivation without causing undesired thickening of the gate dielectric.

SUMMARY OF THE INVENTION

To meet this and other needs, and in view of its purposes, the present invention provides a method for passivating surface states in an integrated circuit structure comprising a gate conductor having a gate dielectric layer. The method comprises, as its primary step, fabricating a solid state source of fluorine in close proximity to the gate dielectric layer. The present invention further encompasses an integrated circuit structure comprising a substrate having a gate dielectric layer on the substrate; a gate conductor on the substrate above the gate dielectric layer; and a solid state source of fluorine in close proximity to the gate dielectric layer.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced to enhance clarity. Included in the drawing are the following figures:

FIG. 3 is a schematic illustration of an exemplary MOS gate structure comprising a deep trench capacitor having a fluorinated collar insulator in close proximity to the gate structure in accordance with the present invention;

FIG. 4 is a schematic illustration of an exemplary MOS gate structure further comprising fluorinated shallow trench isolation in accordance with the present invention.

DETAILED DESCRIPTION OF INVENTION

Figure 1:
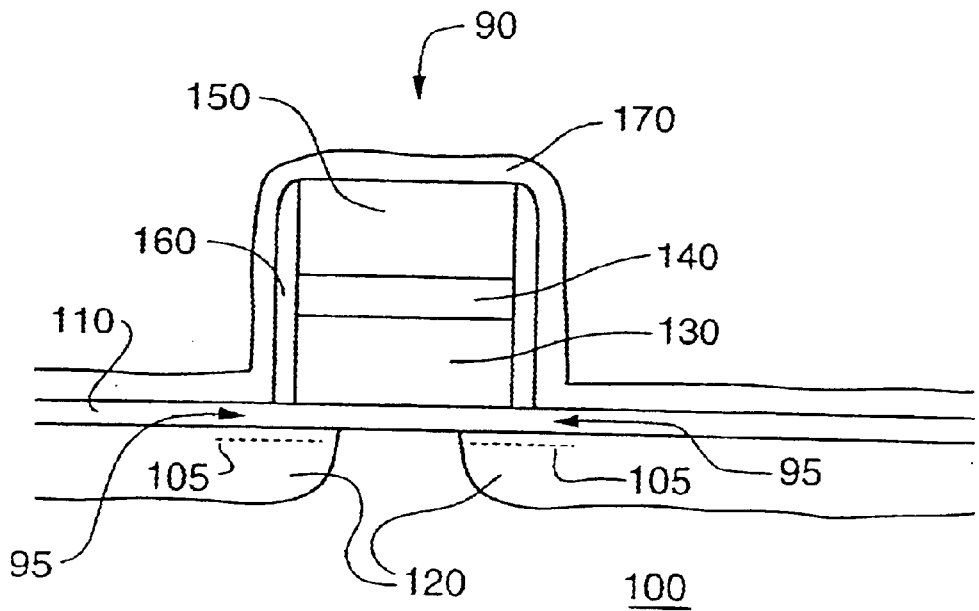
FIG. 1 is a schematic illustration of a MOS gate structure of the prior art.
Figure 2:
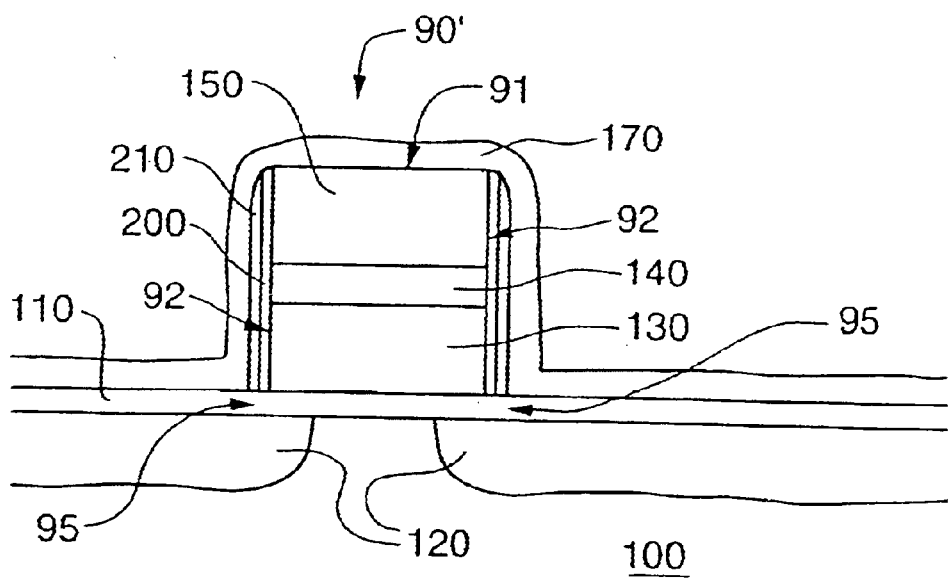
FIG. 2 is a schematic illustration of an exemplary MOS gate structure of the present invention comprising a fluorinated gate spacer.

Referring now to the drawing, wherein like reference numerals refer to like elements throughout, FIG. 2 shows a MOS gate conductor 90'. Gate conductor 90' includes elements similar to the gate conductor 90 of the prior art, as shown in FIG. 1, but incorporates additional elements in accordance with a first embodiment of the present invention. Again, the integrated circuit structure comprises minimally a substrate 100 and gate conductor 90' comprises a gate dielectric layer 110 and an edge region 95. In accordance with the present invention, gate conductor 90' further comprises a fluorinated spacer layer 200 on the sides of gate conductor 90'.

The fluorinated spacer layer 200 provides a solid state source of fluorine in close proximity to the gate dielectric and, specifically, close to the gate conductor edge region 95. Upon annealing, fluorine from fluorinated spacer layer 200 can diffuse to the critical device interfaces and robustly passivate surface states. Use of a solid state source of fluorine adjacent to, rather than as a part of, the gate dielectric avoids the drawbacks, described in the background section above, inherent in having fluorine directly incorporated into the gate dielectric itself.

As shown in FIG. 2, gate conductor 90' has a composite spacer consisting of silicon nitride spacer layer 210 over fluorinated spacer layer 200. In an alternate embodiment, not shown, the spacer may comprise merely a single fluorinated spacer layer 200. In the composite spacer shown in FIG. 2, silicon nitride spacer layer 210 acts as a diffusion barrier. A single or composite gate spacer may be formed by first depositing a fluorinated silicon oxide layer conformally over the top 91 and sides 92 of gate conductor 90'. Fluorinated spacer layer 200 may instead comprise a silicon oxide spacer layer, which may be grown in a thermal oxidation process, implanted with fluorine after growth or deposition. If the spacer is an implanted spacer, an angled implant is required.

Once the fluorinated spacer layer 200 is in place, a plasma-enhanced chemical vapor deposition (PECVD) or low-pressure chemical vapor deposition (LPCVD) silicon nitride spacer layer 210 can be deposited over fluorinated spacer layer 200 to make a composite spacer. For either the composite or single layer spacer, an anisotropic etch removes the unwanted layer or layers on top 91 of gate conductor 90', leaving the spacer only on the sides 92 of the gate conductor 90'. The source and drain regions 120 can be implanted either before or after spacer formation.

In an alternate embodiment shown in FIG. 6, the composite fluorinated spacer layer 200 and silicon nitride spacer layer 210 may extend over the top 91 and sides 92 of the gate conductor 90' as a barrier layer. In this embodiment, the composite is similar to encapsulating layer 170.

Fluorinated silicon oxide films can be deposited by PECVD techniques. Specifically, a tetra ethyl orthosilicate may be deposited by PECVD in the presence of a gaseous fluorinated compound, such as $SiF_4$, $C_2F_6$, or $NF_3$. Different process equipment, recipes, and fluorine precursors result in films that have different fluorine levels and different fluorine retention properties. For high density plasma (HDP) films, fluorine is strongly incorporated, whereas PECVD produces films with more mobile fluorine.

The usable range of fluorine content in the oxide depends on three factors: (1) the method of depositing the fluorinated oxide, which determines how tightly the fluorine is bound; (2) the "thermal budget" of the remaining process, including the temperature and duration of subsequent annealing steps; and (3) the presence of any other fluorine gettering interfaces. Subject to these conditions, the usable range of fluorine is preferably approximately 0.001 to 1 atomic percent and, more preferably, 0.01 to 0.1 atomic percent. This range is equivalent to an estimated doping level in the range of about $1-5 \times 10^{20}$ F atoms/cm$^3$, but greater or lesser dopings are possible depending on the thermal budget of subsequent processes. Excess fluorine for the subsequent thermal budget may risk too much diffusion of fluorine into the gate dielectric, potentially causing some of the undesired thickening and hot-electron resistance caused by fluorine in the gate dielectric. Thus, less fluorine is desired for processes with a high thermal budget for the subsequent process steps, whereas more fluorine may be needed for processes having a low thermal budget in subsequent process steps.

Referring now to FIG. 3, there is shown an alternate embodiment of the present invention. A deep trench capacitor 290 having a fluorinated collar 320 is located in close proximity to the gate conductor 90. Gate conductor 90 as shown in FIG. 3 is similar to gate conductor 90 in FIG. 1, with similar elements having similar numbers.

Trench capacitor 290 may be formed by any method known in the art. An exemplary process for making such a trench capacitor 290 is to first etch a trench 295 into substrate 100, and then grow a thin dielectric node film 300 within the trench 295. Typically, film 300 is an oxynitride composite and forms the capacitor dielectric. Doped polysilicon 310 fills trench 295 and forms one plate of the capacitor. A second etch process is done to recess the doped polysilicon 310 below the surface of substrate 100. Then, a fluorinated film is deposited over the surface of substrate 100 and into the recessed portion of doped polysilicon 310 in trench 295. The fluorinated film is then etched anisotropically to form collar 320. Finally, a second doped polysilicon layer 310' is deposited on top of doped polysilicon 310 to form a continuous doped polysilicon fill region 310 and 310'. A recess in second doped polysilicon layer 310' is etched with a third etching process, and a second oxide layer 330 is deposited to form an insulating cap to complete the structure of deep trench capacitor 290.

Each of the gate films—gate dielectric layer 110, polysilicon layer 130, silicide layer 140, and insulator layer 150—may then be created by any method known in the art. The top of trench capacitor 290 electrically contacts the source and drain regions 120 via a connecting strap 340, formed by a method well known in the art, such as by recessing the collar 320 and allowing second doped polysilicon layer 310' to fill the recess, as shown, or by interposing an additional structure connecting second doped polysilicon layer 310' to source and drain regions 120.

In this embodiment, the fluorinated collar 320 provides the solid state source of fluorine in the structure. Fluorinated collar 320 may be composed of a fluorinated silicon oxide or formed by a silicon oxide implanted with fluorine. Again, if an implanting process is used, an angled implant is necessary. Because the purpose of fluorinated collar 320 is to isolate trench capacitor 290 from source and drain regions 120, fluorinated collar 320 is necessarily located near the critical edge region 95.

Referring now to FIG. 4, there is shown another embodiment of the present invention. Again, gate conductor 90 is similar to the gate conductor shown in FIG. 1, having similar elements indicated by similar numbers. In this embodiment, however, shallow trench isolation (STI) is used to isolate active regions of the device of which gate conductor 90 is a part.

STI is completed using the following basic methodology well known in the art. A doped wafer having a substrate 100 may have various structures already present such as implanted regions (not shown) or devices such as capacitors (not shown). STI trenches such as trench 395 are etched in substrate 100, and then an oxide film 400 or films are deposited in trench 395 as fill. In accordance with the present invention, at least one or more of the oxide films 400 used to fill the trench 395 are fluorinated. The deposited oxide film or films 400 is or are planarized so that the levels of the substrate 100 and fill oxide film 400 are nearly coincident. The gate conductor 90 and source and drain regions 120 (forming a junction or junctions) are then created as required.

Trench 395 may be filled completely with fluorinated silicon oxide film 400, as shown in FIG. 4, or the walls 396 of trench 395 may instead be implanted with fluorine before a non-fluorinated silicon oxide fill. In the alternative, a liner (not shown) may be deposited in trench 395 before fill. This liner may be fluorinated silicon oxide or may be implanted with fluorine before the non-fluorinated silicon oxide fill. Some combination of fluorinated walls, liner, or fill may be used.

Figure 5:
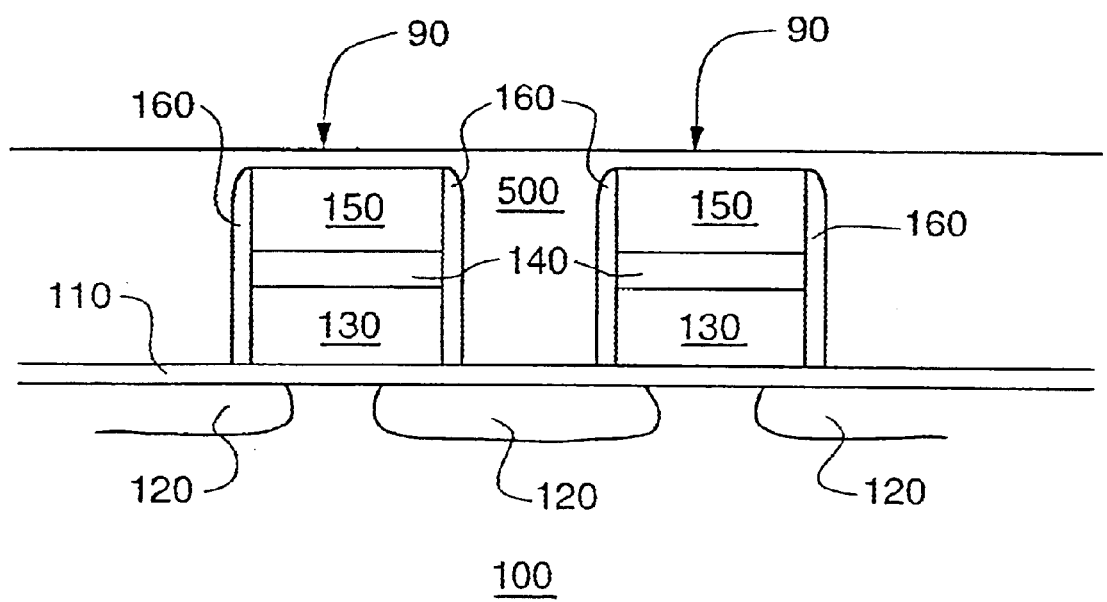
FIG. 5 is a schematic illustration of a plurality of exemplary MOS gate structures comprising dielectric fill between the structures in accordance with the present invention.

Referring now to FIG. 5, there is shown another alternate embodiment of the present invention. A plurality of gate conductors 90, each similar to gate conductor 90 in FIG. 1 and having similar elements with similar numbers, are formed on substrate 100. The area between gate conductors 90 is filled with a dielectric fill 500 that comprises a fluorinated silicon oxide. Using fluorinated silicon oxide as dielectric fill 500 provides the solid state source of fluorine in accordance with the present invention, as long as no barrier layer is present that would prevent the diffusion of fluorine to critical device interfaces. One such barrier layer would be a silicon nitride encapsulating film 170 as shown in FIG. 1. A silicon nitride spacer film 160, as shown in FIG. 1, can also prevent efficient fluorine diffusion to device interfaces.

In yet an alternate embodiment of the present invention, instead of or in addition to dielectric fill 500 comprising a fluorinated silicon oxide, gate insulator layer 150 may comprise a fluorinated oxide. The advantage of this embodiment is that the fluorine can diffuse through the silicide layer 140 and polysilicon layer 130 directly to the gate dielectric layer 110 even if the gate has a silicon nitride spacer film 160, an encapsulating film 170, or both films.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit structure comprising:
   a substrate having a gate dielectric layer on a surface thereof, at least a portion of the substrate being doped;
   a gate conductor on said substrate above a portion of said gate dielectric layer,
   a source and a drain implanted in said substrate extending at least partially under said gate conductor and isolated therefrom by said gate dielectric layer, forming source and drain overlap regions respectively;
   a solid state source of fluorine in close proximity to said overlap regions; and at least one collar formed in at least deep trench capacitor formed in said substrate adjacent to said gate conductor, said deep trench capacitor having a polysilicon contact; wherein said collar defining a region isolating said trench capacitor from said doped substrate region, said collar comprising a material selected from the group consisting of fluorinated silicon oxide and fluorine implanted silicon oxide.

2. The integrated circuit structure according to claim 1, wherein said solid state source comprises a fluorinated oxide.

3. The integrated circuit structure according to claim 1, wherein said solid state source comprises silicon oxide with fluorine implanted therein.

4. The integrated circuit structure according to claim 1, wherein the gate conductor further comprises an edge forming a corner between said gate conductor and said gate dielectric layer, and the solid state source is in close proximity to said corner.

5. The integrated circuit structure according to claim 1, wherein the usable range of fluorine content is in the range between 0.001 and 1 atomic percent.

6. The integrated circuit structure according to claim 5 wherein the usable range of fluorine content is in the range between 0.01 and 0.1 atomic percent.

7. The integrated circuit structure according to claim 5 wherein the fluorine concentration is in the range between $1-5 \times 10^{20}$ atoms/cm$^3$.

8. The integrated circuit structure according to claim 1 wherein said gate conductor further comprises a top and a plurality of sides, and wherein said solid state source comprises a gate spacer located on said gate conductor sides.

9. The integrated circuit structure according to claim 8 wherein said gate spacer has said fluorine implanted therein.

10. The integrated circuit structure according to claim 8 wherein said gate spacer comprises a layer of fluorinated silicon oxide.

11. The integrated circuit structure according to claim 10 wherein said gate spacer further comprises a layer of silicon nitride over said layer of fluorinated silicon oxide.

12. The integrated circuit structure according to claim 10 wherein said silicon nitride layer and said fluorinated silicon oxide layer extend over said top of said gate conductor and over said gate dielectric layer.

13. The integrated circuit structure according to claim 1, further comprising a plurality of gate conductors having spaces therebetween, said spaces filled with fluorinated silicon oxide.

14. The integrated circuit structure according to claim 1, wherein said gate conductor has a gate insulator layer comprising fluorinated oxide.

* * * * *